United States Patent
Hsu et al.

(10) Patent No.: US 10,312,564 B2
(45) Date of Patent: Jun. 4, 2019

(54) FILTER

(71) Applicant: AMBIT MICROSYSTEMS (SHANGHAI) LTD., Shanghai (CN)

(72) Inventors: Ming-Hsien Hsu, New Taipei (TW); Shii-Rong Den, New Taipei (TW)

(73) Assignee: AMBIT MICROSYSTEMS (SHANGHAI) LTD., Shanghai (CN)

( * ) Notice: Subject to any disclaimer, the term of this patent is extended or adjusted under 35 U.S.C. 154(b) by 0 days.

(21) Appl. No.: 15/591,212

(22) Filed: May 10, 2017

(65) Prior Publication Data

US 2018/0302056 A1    Oct. 18, 2018

(30) Foreign Application Priority Data

Apr. 13, 2017 (TW) .............................. 106112368 A

(51) Int. Cl.
*H01P 1/203* (2006.01)
*H03H 7/03* (2006.01)
(Continued)

(52) U.S. Cl.
CPC .............. *H01P 1/203* (2013.01); *H03H 7/03* (2013.01); *H05K 1/0242* (2013.01); *H05K 1/115* (2013.01);
(Continued)

(58) Field of Classification Search
CPC ........ H03H 7/03; H05K 1/0242; H05K 1/115; H05K 2201/0373; H05K 2201/0776; H01P 1/203; H01P 1/2013; H01P 1/20372
(Continued)

(56) References Cited

U.S. PATENT DOCUMENTS

| 2001/0030588 A1 | 10/2001 | Son et al. |
| 2011/0063046 A1 | 3/2011 | Fujiwara et al. |
| 2016/0261729 A1 | 9/2016 | Kim |

FOREIGN PATENT DOCUMENTS

| CN | 101728610 A | 6/2010 |
| CN | 105552494 A | 5/2016 |

(Continued)

OTHER PUBLICATIONS

Kikkert, "A design technique for microstrip filters", IEEE 2008 2nd International Conference on Signal Processing and Communication Systems, Dec. 15-17, 2008, pp. 1-5.*

(Continued)

*Primary Examiner* — Benny T Lee
*Assistant Examiner* — Hafizur Rahman
(74) *Attorney, Agent, or Firm* — ScienBiziP, P.C.

(57) ABSTRACT

A filter is disposed on a base board. The filter includes a first portion, a second portion, a ground portion, a first coupling portion and a second coupling portion. The first portion is disposed on a first layer in the base board to input signals. The second portion is disposed on the first layer to output signals. The ground portion is disposed on a second layer in the base board. The first coupling portion is disposed on the first layer. The first coupling portion is electrically coupled to the first portion and the second portion. The first coupling portion is electrically coupled to the ground portion through via holes. The second coupling portion is disposed on the first layer. The second coupling portion is electrically coupled to the first portion and the second portion. The second coupling portion is electrically coupled to the ground portion through the via holes.

11 Claims, 3 Drawing Sheets

(51) Int. Cl.
*H05K 1/02* (2006.01)
*H05K 1/11* (2006.01)
*H01P 1/201* (2006.01)

(52) U.S. Cl.
CPC ........ *H01P 1/2013* (2013.01); *H01P 1/20372* (2013.01); *H05K 2201/0373* (2013.01); *H05K 2201/0776* (2013.01)

(58) Field of Classification Search
USPC ........................................................ 333/204
See application file for complete search history.

(56) References Cited

FOREIGN PATENT DOCUMENTS

| | | |
|---|---|---|
| CN | 105990629 A | 10/2016 |
| CN | 207165728 U | 3/2018 |

OTHER PUBLICATIONS

Vidhya et al., "Performance Enhancement of Microstrip Hairpin Band Pass Filter Using Dumbbell DGS and Split Ring Resonator DGS", International Journal of Information and Electronics Engineering, vol. 1, No. 1, Jul. 2011.*

Chun-Ping Chen et al,"Novel Wideband Bandpass Filter Using Open-Ended Stub Loaded Parallel Coupled Short-Circuited Three-Line Unit", (2009 IEEE MTT-S international microwave symposium digest} , 20090612.

* cited by examiner

FILTER

FIELD

The subject matter herein generally relates to a signal processing device, particularly relates to a filter.

BACKGROUND

Nowadays, most mobile phones or tablet computers have multiple band communication modes, such as 2.4G WIFI (2.4 Giga WIreless-Fidelity) and 5G WIFI. However, there are few devices to prevent noise interference from 5G frequency band. Thus, the lack of devices that can prevent noise interference from 5G frequency band significantly affects signal communications.

BRIEF DESCRIPTION OF THE DRAWING

Implementations of the present technology will now be described, by way of example only, with reference to the attached figures, wherein.

DETAILED DESCRIPTION

Figure 1:
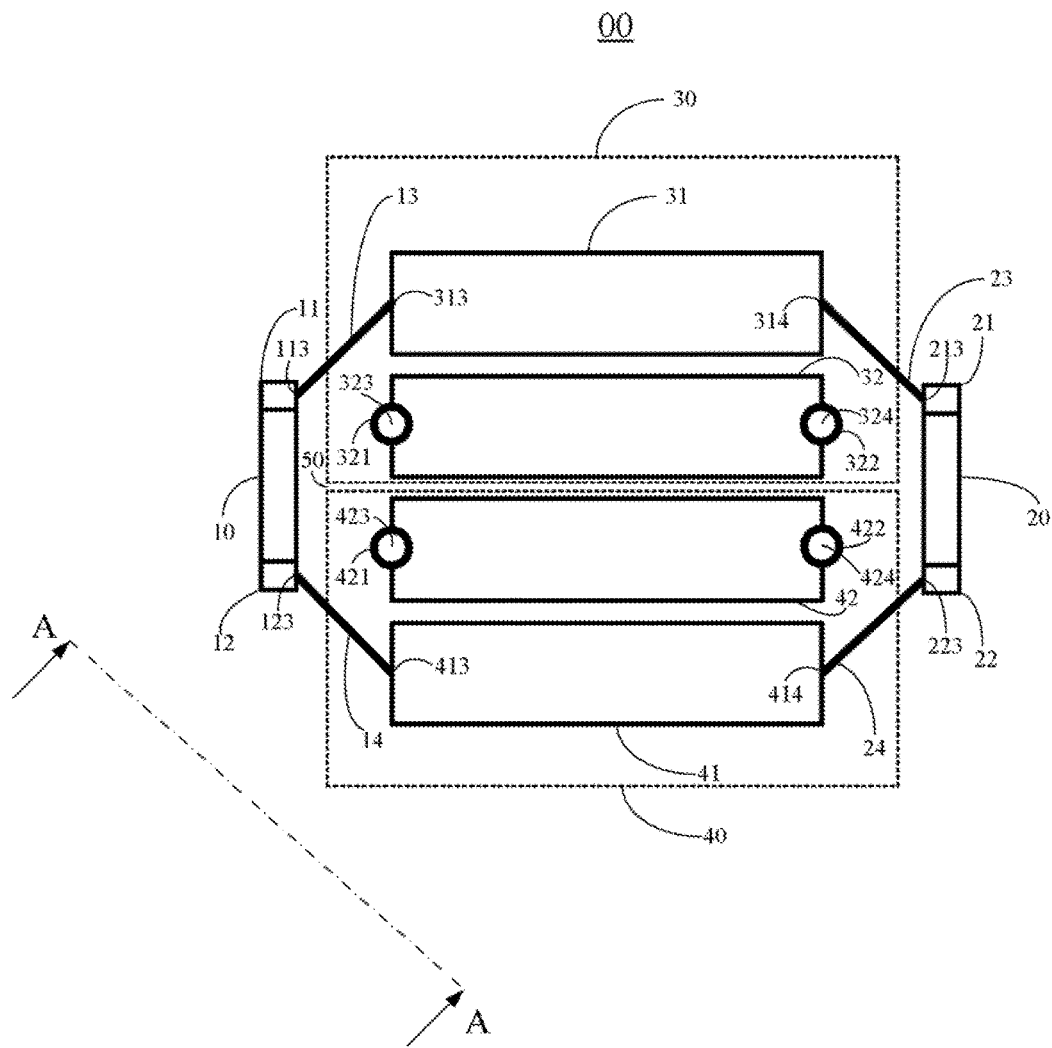
FIG. 1 illustrates a top view of an exemplary embodiment of a filter.

It will be appreciated that for simplicity and clarity of illustration, where appropriate, reference numerals have been repeated among the different figures to indicate corresponding or analogous elements. In addition, numerous specific details are set forth to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale, and the proportions of certain parts have been exaggerated to illustrate details and features of the present disclosure better. The disclosure is illustrated by way of example and not by way of limitation in the figures of the accompanying drawings in which like references indicate similar elements. It should be noted that references to "an" or "one" exemplary embodiment in this disclosure are not necessarily to the same exemplary embodiment, and such references mean at least one.

Several definitions that apply throughout this disclosure will now be presented. The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series and the like.

Figure 2:
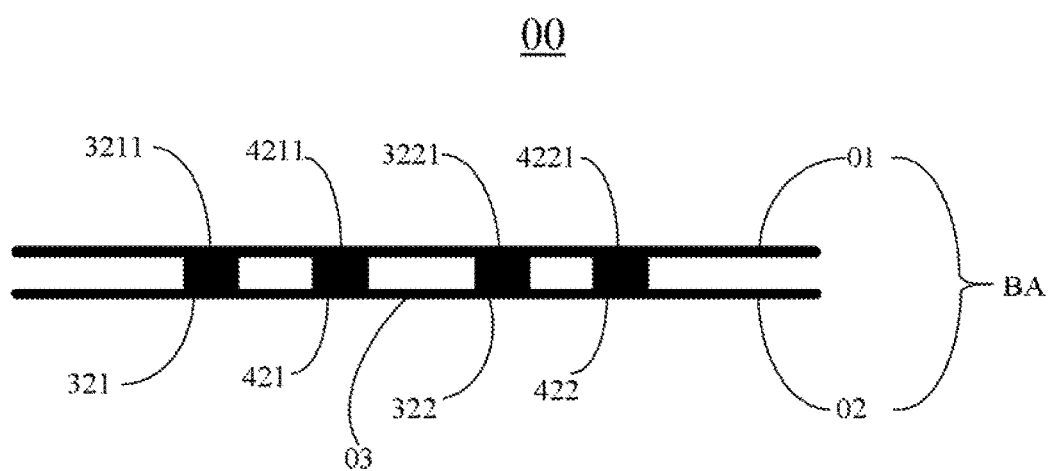
FIG. 2 illustrates a side view of an exemplary embodiment of a filter.

FIG. 1 illustrates a top view of an exemplary embodiment of a filter 00. FIG. 2 illustrates a side view of an exemplary embodiment of a filter 00. In at least one exemplary embodiment, the side view is taken along line A-A in FIG. 1.

In the embodiment, a filter 00 is disposed on a base board BA. The filter 00 can filter signals. Thus, noise interference could be suppressed. The base board BA is a printed circuit board (PCB). Electrical characteristics of a PCB can be chosen according to desired signal suppression frequencies. For example, we can choose an FR-4 PCB to be the base board BA.

Please refer to FIG. 1 and FIG. 2, as shown in FIG. 1 and FIG. 2, the filter 00 comprises a first portion 10, a second portion 20, a ground portion 03, a first coupling portion 30 and a second coupling portion 40.

The first portion 10 is disposed on a first layer 01 in the base board BA. The first portion 10 is configured to input signals. The second portion 20 is disposed on the first layer 01 in the base board BA. The second portion 20 is configured to output signals. The ground portion 03 is disposed on a second layer 02. The first coupling portion 30 is also disposed on the first layer 01. The first coupling portion 30 is electrically coupled to the first portion 10 and the second portion 20. The first coupling portion 30 is electrically coupled to the ground portion 03 through some via holes 321, 322, 421 and 422. The second coupling portion 40 is also disposed on the first layer 01. The second coupling portion 40 is electrically coupled to the first portion 10 and the second portion 20. The second coupling portion 40 is electrically coupled to the ground portion 03 through the via holes 321, 322, 421 and 422.

In at least one exemplary embodiment, the base board BA is a PCB with two layers 01, 02. Thus, the first layer 01 is one surface of the base board BA. The second layer 02 is another surface of the base board BA. In another exemplary embodiment, the base board BA can be a multiple layer PCB. The first layer 01 and the second layer 02 can be any inner layers or surface.

As shown in FIG. 1, the first coupling portion 30 and the second coupling portion 40 are parallel to each other. The first coupling portion 30 and the second coupling portion 40 are not electrically coupled together by any conductors. The first coupling portion 30 and the second coupling portion 40 form a gap 50. The first coupling portion 30 comprises a first branch 31 and a second branch 32. The first branch 31 and the second branch 32 are rectangles. The first branch 31 and the second branch 32 are parallel to each other. The first branch 31 and the second branch 32 are not electrically coupled together by any conductors. The first branch 31 and the second branch 32 have substantially the same length. The second coupling portion 40 comprises a third branch 41 and a fourth branch 42. The third branch 41 and the fourth branch 42 are also rectangles. The third branch 41 and the fourth branch 42 and the first branch 31 are parallel to each other. The third branch 41 and the fourth branch 42 are not electrically coupled together by any conductors. The third branch 41, the fourth branch 42 and the first branch 31 have substantially the same length.

In the exemplary embodiment, to have good electrical filtering characteristics, the filter 00 further comprises a first square portion 11, a second square portion 12, a third square portion 21 and a fourth square portion 22. In other exemplary embodiments, each square portion can be rectangles. The first square portion 11, the second square portion 12, the third square portion 21 and the fourth square portion 22 are configured to have matching impedance.

A first square portion 11 first end and the first portion 10 first end are electrically coupled together. A first square portion 11 second end is electrically coupled to a first branch 31 first end through a first microstrip 13. A second square portion 12 first end is electrically coupled to a first portion 10 second end. A second square portion 12 second end is electrically coupled to a third branch 41 first end through a second microstrip 14. A third square portion 21 first end and a second portion 20 first end are electrically coupled together. A third square portion 21 second end is electrically coupled to a first branch 31 second end through a third microstrip 23. A fourth square portion 22 first end is electrically coupled to a second portion 20 second end. A fourth square portion 22 second end is electrically coupled to a third branch 41 second end through a fourth microstrip 24.

In the exemplary embodiment, the first microstrip 13 is electrically coupled between a first square portion 11 second end midpoint 113 and a first branch 31 first end midpoint 313. The second microstrip 14 is electrically coupled between a second square portion 12 second end midpoint 123 and a third branch 41 first end midpoint 413. The third microstrip 23 is electrically coupled between a third square portion 21 second end midpoint 213 and a first branch 31 second end midpoint 314. The fourth microstrip 24 is electrically coupled between a fourth square portion 22 second end midpoint 223 and a third branch 41 second end midpoint 414.

In the exemplary embodiment, four via holes are defined in the filter 00. The four via holes are coupled to the ground portion 03. The four via holes comprise a first via hole 321, a second via hole 322, a third via hole 421 and a fourth via hole 422. A first via hole 321 wall is electrically coupled between a second branch 32 first end and the ground portion 03. A second via hole 322 wall is electrically coupled between a second branch 32 second end and the ground portion 03. A third via hole 421 wall is electrically coupled between a fourth branch 42 first end and the ground portion 03. A fourth via hole 422 wall is electrically coupled between a fourth branch 42 second end and the ground portion 03.

In the first layer 01, a first via hole 321 central point 3211 and a second branch 32 first end midpoint 323 overlap. A second via hole 322 central point 3221 and a second branch 32 second end midpoint 324 overlap. A third via hole 421 central point 4211 and a fourth branch 42 first end midpoint 423 overlap. A fourth via hole 422 central point 4221 and a fourth branch 42 second end midpoint 424 overlap.

Figure 3:
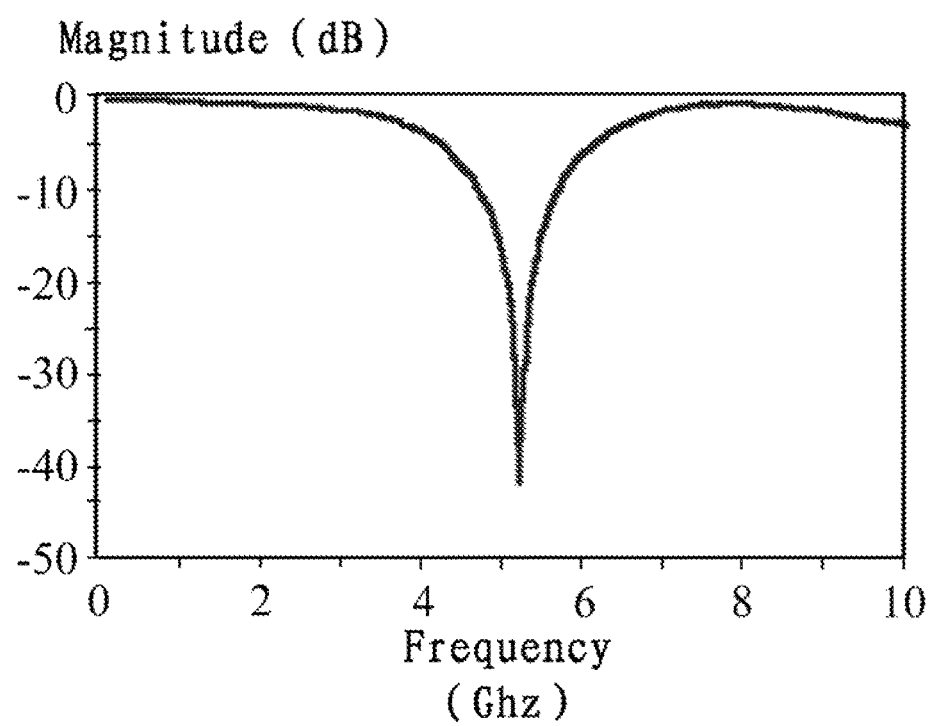
FIG. 3 illustrates a measurement diagram of an exemplary embodiment of a filter.

FIG. 3 illustrates an S21 measurement diagram of an exemplary embodiment of a filter 00. As shown in FIG. 3, when a curve is in the lowest point, a frequency is 5.163 GHz, the filter 00 can reach −47.880 dB. Namely, when 5 GHz signals are transmitted in the filter 00, the 5 GHz signals cannot be transmitted through the filter 00 without undergoing energy loss. Other frequency signals, however, can be transmitted through the filter 00, can be transmitted through the filter 00. Thus, the filter 00 can be applied to process noise interference in 5 GHz band.

In addition, the filter can be disposed on a PCB area about 4 millimeters by about 6.4 millimeters. The filter occupies small space.

In the present disclosure, the filter has good filtering performances. Not only the filter can be used to suppress noise interference in frequency band, but also the filter can be suitable for thin and short product design.

Many details are often found in art including other features of the filter. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will, therefore, be appreciated that the exemplary embodiments described above may be modified within the scope of the claims.

What is claimed is:

1. A filter disposed on a base board, comprising:
a first portion disposed on a first layer in the base board, the first portion configured to input signals;
a second portion disposed on the first layer, the second portion configured to output signals;
a ground portion disposed on a second layer in the base board;
a first coupling portion comprising a first branch and a second branch, disposed on the first layer, wherein the first branch is electrically coupled to the first portion and the second portion, and the second branch is electrically coupled to the ground portion through via holes;
a second coupling portion comprising a third branch and a fourth branch, disposed on the first layer, wherein the third branch is electrically coupled to the first portion and the second portion, and the fourth branch is electrically coupled to the ground portion through other via holes; wherein
the via holes comprises:
a first via hole, wherein a wall of the first via hole is electrically coupled between a first end of the second branch and the ground portion;
a second via hole, wherein a wall of the second via hole is electrically coupled between a second end of the second branch and the ground portion;
a third via hole, wherein a wall of the third via hole is electrically coupled between a first end of the fourth branch and the ground portion; and
a fourth via hole, wherein a wall of the fourth via hole is electrically coupled between a second end of the fourth branch and the ground portion.

2. A filter disposed on a base board, comprising:
a first portion disposed on a first layer in the base board, the first portion configured to input signals;
a second portion disposed on the first layer, the second portion configured to output signals;
a ground portion disposed on a second layer in the base board;
a first coupling portion comprising a first branch and a second branch, disposed on the first layer, wherein the first branch is electrically coupled to the first portion and the second portion, and second branch is electrically coupled to the ground portion through via holes;
a second coupling portion comprising a third branch and a fourth branch, disposed on the first layer, wherein the third branch is electrically coupled to the first portion and the second portion, and the fourth branch is electrically coupled to the ground portion through other via holes; wherein
the first branch and the second branch are rectangles; the first branch and the second branch are parallel to each other, the third branch and the fourth branch are rectangles; the third branch and the fourth branch and the first branch are parallel to each other; and the via holes comprises:

a first via hole, wherein a wall of the first via hole is electrically coupled between a first end of the second branch and the ground portion;

a second via hole, wherein a wall of the second via hole is electrically coupled between a second end of the second branch and the ground portion;

a third via hole, wherein a wall of the third via hole is electrically coupled between a first end of the fourth branch and the ground portion; and a fourth via hole, wherein a wall of the fourth via hole is electrically coupled between a second end of the fourth branch and the ground portion.

3. A filter disposed on a base board, comprising:

a first portion disposed on a first layer in the base board, the first portion configured to input signals;

a second portion disposed on the first layer, the second portion configured to output signals;

a ground portion disposed on a second layer in the base board;

a first coupling portion comprising a first branch and a second branch, disposed on the first layer, wherein the first branch and the second branch are rectangles, and the first branch and the second branch are parallel to each other; and one end of the first branch is electrically coupled to the first portion, the other end of the first branch is electrically coupled to the second portion, one end of the second branch and the other end of the second branch are electrically coupled to the ground portion through via holes; and a second coupling portion disposed on the first layer wherein the second coupling portion is electrically coupled to the first portion and the second portion, the second coupling portion is electrically coupled to the ground portion through other via holes.

4. The filter of claim 3, wherein the first branch and the second branch have a same length.

5. The filter of claim 3, wherein the second coupling portion comprises a third branch and a fourth branch; the third branch and the fourth branch are rectangles; and the third branch and the fourth branch and the first branch are parallel to each other.

6. The filter of claim 5, wherein the third branch, the fourth branch and the first branch have a same length.

7. The filter of claim 5, wherein:

the first portion comprises a first square portion at a first end and a second square portion at a second end;

the second portion comprises a third square portion at a first end and a fourth square portion at a second end;

the first square portion comprises a first end, and a second end electrically coupled to the one end of the first branch through a first microstrip;

the second square portion comprises a first end, and a second end electrically coupled to a first end of the third branch through a second microstrip;

the third square portion comprises a first end, and a second end electrically coupled to the other end of the first branch through a third microstrip; and the fourth square portion comprises a first end, and a second end electrically coupled to a second end of the third branch through a fourth microstrip;

wherein the first square portion, the second square portion, the third square portion and the fourth square portion are configured to have matching impedance.

8. The filter of claim 7, wherein the first microstrip is electrically coupled between a midpoint of the second end of the first square portion and a midpoint of the one end of the first branch; the second microstrip is electrically coupled between a midpoint of the second end of the second square portion and a midpoint of the first end of the third branch; the third microstrip is electrically coupled between a midpoint of the second end of the third square portion and a midpoint of the other end of the first branch; and the fourth microstrip is electrically coupled between a midpoint of the second end of the fourth square portion and a midpoint of the second end of the third branch.

9. The filter of claim 5, the via holes comprising:

a first via hole, wherein a wall of the first via hole is electrically coupled between the one end of the second branch and the ground portion;

a second via hole, wherein a wall of the second via hole is electrically coupled between the other end of the second branch and the ground portion;

a third via hole, wherein a wall of the third via hole is electrically coupled between a first end of the fourth branch and the ground portion; and a fourth via hole, wherein a wall of the fourth via hole is electrically coupled between a second end of the fourth branch and the ground portion.

10. The filter of claim 9, wherein in the first layer, a central point of the first via hole and a midpoint of the one end of the second branch overlap; a central point of the second via hole and a midpoint of the other end of the second branch overlap; a central point of the third via hole and a midpoint of the first end of the fourth branch overlap; and a central point of the fourth via hole and a midpoint of the second end of the fourth branch overlap.

11. The filter of claim 3, wherein the first coupling portion and the second coupling portion are parallel to each other in the first layer.

* * * * *